United States Patent [19]

Jambotkar

[11] 4,128,439
[45] Dec. 5, 1978

[54] METHOD FOR FORMING SELF-ALIGNED FIELD EFFECT DEVICE BY ION IMPLANTATION AND OUTDIFFUSION

[75] Inventor: Chakrapani G. Jambotkar, Hopewell Junction, N.Y.

[73] Assignee: International Business Machines Corporation, Armonk, N.Y.

[21] Appl. No.: 820,991

[22] Filed: Aug. 1, 1977

[51] Int. Cl.² .................................... H01L 21/265
[52] U.S. Cl. .................................. 148/1.5; 357/23; 357/91; 148/187
[58] Field of Search ............... 148/187, 191, 1.5; 29/571; 357/23, 91

[56] References Cited

U.S. PATENT DOCUMENTS

| | | | |
|---|---|---|---|
| 3,723,199 | 3/1973 | Vora | 148/175 |
| 3,734,787 | 5/1973 | Dhaka et al. | 148/175 |
| 3,767,486 | 10/1973 | Imaizumi | 148/175 |
| 3,899,373 | 8/1975 | Antipov | 148/187 |
| 3,948,694 | 4/1976 | Mills | 148/187 |
| 4,001,048 | 1/1977 | Meiling et al. | 148/1.5 |
| 4,004,950 | 1/1977 | Baruch et al. | 148/1.5 |
| 4,032,372 | 6/1977 | Vora | 148/175 |
| 4,046,606 | 9/1977 | Lambert | 148/187 |
| 4,058,887 | 11/1977 | DeWitt | 29/571 |

OTHER PUBLICATIONS

Z. C. Putney, "Self-Aligned Ion Implanted Guard Ring for High-Junction Breakdown Voltage", IBM-TDB, 17, (1975), 2359.
Double et al., "FET Gate Integrity by Ion-Implantation", IBM-TDB., vol. 16 (1973), 8.
Makris et al., "Forming Fine-Line Geometries in Integrated Circuits", IBM-TDB., vol. 16 (1974), 3240.

*Primary Examiner*—L. Dewayne Rutledge
*Assistant Examiner*—Upendra Roy
*Attorney, Agent, or Firm*—J. B. Kraft

[57] ABSTRACT

A method is provided for making a field effect transistor which comprises forming a layer of an ion beam masking material on the surface of a semiconductor body of one-type conductivity having at least two adjacent apertures with at least a portion of the masking layer between these apertures and in contact with the semiconductor body surface being an electrically insulative material. Then, a beam of ions of opposite-type conductivity is directed at the mask body at an energy and dosage sufficient to form two buried regions of opposite-type conductivity fully enclosed within said one-type body respectively beneath these two apertures. Finally, sufficient heat is applied so that the two buried regions diffuse upward until they extend respectively to the surface of the semiconductor body beneath the two apertures; the masking material must have a melting point above the temperature of the diffusion step.

12 Claims, 10 Drawing Figures

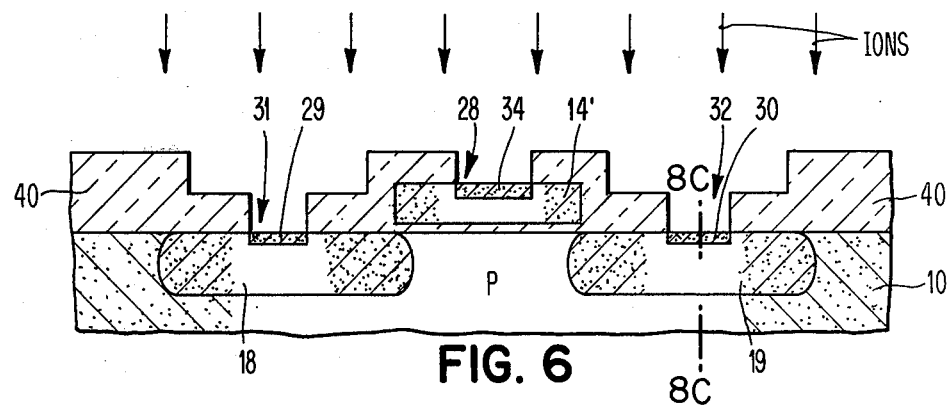
FIG. 6
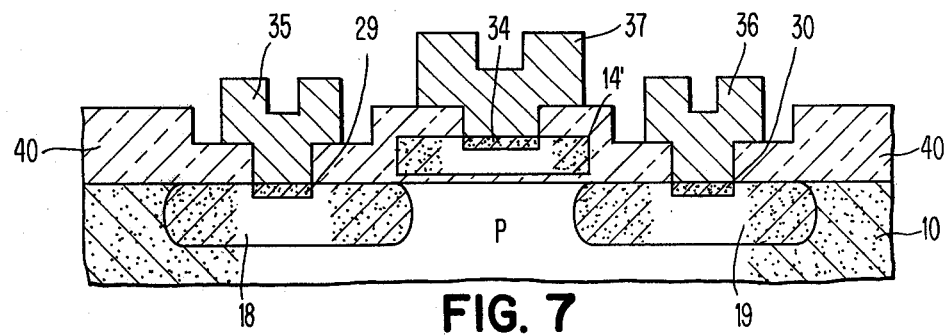
FIG. 7
FIG. 8A
FIG. 8B
FIG. 8C

METHOD FOR FORMING SELF-ALIGNED FIELD EFFECT DEVICE BY ION IMPLANTATION AND OUTDIFFUSION

BACKGROUND OF THE INVENTION

The present invention relates to a method for forming semiconductor devices and integrated circuits containing such devices. More particularly, it relates to the formation of FET devices and especially to FET devices having self-aligned gates. Self-aligned gate field effect structures are well-known in the art. They are conventionally formed by processes which involve using a mask of a refractory material, i.e., a material which withstands high temperatures in the order of 1,000° C. and above, as a masking material during the introduction of impurities which are to form the source and drain of the FET. Conventionally, this masking material may be material such as silicon in processes such as that described in U.S. Pat. No. 3,475,234, Kerwin et al., and U.S. Pat. No. 3,544,399, Dill, using polysilicon as such a masking material which remains in place in the gate region to eventually provide the gate electrode. Since such structures are insulated gate field effect transistors, IGFETs, there is a layer of an insulative material such as silicon dioxide beneath the silicon in the mask.

On the other hand, the refractory material may be an insulative material itself such as silicon nitride which may remain in place in the gate region to provide the gate insulation. Such methods are described in U.S. Pat. No. 3,544,858, Kooi, as well as in U.S. Pat. No. 4,058,887 DeWitt, filed Oct. 13, 1972. In these processes, the refractory material such as silicon nitride, or a composite of silicon nitride over silicon dioxide, serves to define the edges of the source and drain regions abutting the gate and which may then remain in place to function as the thin gate insulation in the IGFET. This is accomplished by thermally growing a thick oxide over the source and drain with the in-place silicon nitride serving the subsequent function of an oxidation blocking mask to to prevent any increase in the thickness of the thin gate insulation. Then, a conductive gate electrode is formed over the gate region with the thin silicon nitride layer or any other thin insulative layer formed after removal of the silicon nitride still functioning to define the functional gate region.

The major advance of the self-aligned gate was that it improved the positioning of the gate electrode and the gate insulation with respect to the source and drain. Previous to the self-aligned gate, the functional gate electrode, i.e., the portion of the gate electrode overlying the thin gate insulation had to be made too long relative to the channel length between the source and drain, i.e., this functional gate electrode considerably overlapped the source and drain. Hence, undesirable and excessive stray capacitance was developed between the functional gate electrode and the underlying source and drain. This substantially reduced the frequency response or speed of the FET devices in an integrated circuit.

While the self-aligned gate technologies in the prior art substantially reduced the extent of such undesirable functional gate overlap and thus substantially increased the integrated circuit switching time, it did not fully eliminate the problem of the functional gate electrode overlapping the source and drain. This was primarily due to the processing requirement, even with the self-aligned gate in place, of forming the source and drain by a diffusion step. Conventionally, this diffusion step may be carried out directly during the introduction of impurities forming the source and drain into the substrate with the self-aligning gate mask in place. Alternatively, these impurities may be introduced first by diffusion or ion implantation to form shallow surface regions followed by a high temperature drive-in step which then diffuses the source and drain deeper into the substrate. During such diffusion steps, the impurities would, of course, spread laterally beneath the gate masking member to some extent. Thus, the result would be some overlap of the source and drain by the functional gate electrode due to this lateral spreading during diffusion. This would still cause the undesirable stray capacitances described above which would reduce switching speeds and frequency responses of the devices.

It has been suggested in the prior art that self-aligned IGFETs may be formed by ion implantation alone without any diffusion step. U.S. Pat. No. 3,472,712 is representative of such a teaching. Certainly, structures formed in this manner will not have the undesirable gate overlap problem. However, such processes normally have the limitation that they are limited to source and drain regions which extend only to a depth of 2,000 Å–3,000 Å or less into the substrate. As a result, such source and drain regions have high resistances, i.e., sheet resistances in the order of 50 ohms per square. While such high sheet resistances are perfectly acceptable for many discrete FET device functions as well as for simpler FET integrated circuits, in the more complex FET integrated circuit technology where the source and drain regions or extensions thereof are used as part of the conductive interconnector network, much lower sheet resistances, in the order of from 8 to 10 ohms per square, become necessary. The art has conventionally achieved such low resistance source and drain regions by one of the above described diffusion techniques to form source and drain regions extending in the order of 1 micron (10,000 A) into the substrate. While it may be possible to form FETs with source and drain regions extending 10,000 A into the substrate to thus achieve the necessary low resistivity by ion implantation alone without subsequent diffusion, such ion implantation techniques would be expected to be quite complicated and would entail a series of ion implantations at a variety of energy and dosage levels.

SUMMARY OF THE PRESENT INVENTION

Accordingly, it is the primary object of the present invention to provide a method for forming self-aligned field effect transistors having a minimum of overlap of the functional gate electrode with respect to the source and drain.

It is another object of the present invention to provide a method involving diffusion for forming a self-aligned field effect transistor structure having a minimum of overlap of the functional gate electrode with respect to the source and drain.

It is yet another object of the present invention to provide a method for forming a self-aligned FET structure having a minimum overlap between the functional gate electrode with respect to the source and drain and further having source and drain regions with relatively low sheet resistivity.

It is a further object of the present invention to provide a method for forming self-aligned FET structures having a minimum overlap of the functional gate electrode with respect to the source and drain and in which the source and drain region extend relatively deep into the substrate.

It is yet a further object of the present invention to provide a method for forming a self-aligned field effect transistor structure involving high temperatures in the order of 950° C. or higher while still minimizing the overlap of the functional gate electrode with respect to the source and drain.

The above and other objects of the present invention are achieved by a method for forming a semiconductor device which comprises first forming a layer of ion beam masking material on the surface of a semiconductor body of one-type conductivity, said masking layer having formed therein at least one pair of adjacent apertures, and then directing a beam of ions of opposite-type conductivity at the mask body at energy and dosage levels sufficient to form a pair of buried regions of opposite-type conductivity fully enclosed within said one-type conductivity body beneath the pair of apertures. Then, the structure is heated to diffuse the pair of buried regions upward until the buried regions respectively extend to the surface of the semiconductor body beneath the apertures. The masking material must have a melting point above the temperature at which the diffusion step is carried out.

The semiconductor body is preferably a silicon body and at least a portion of the masking layer in contact with the surface of the silicon body is electrically insulative so that the resulting structure is an isolated gate field effect transistor (IGFET). The masking layer in the gate region may be any of the conventional self-aligned gate masking layers, i.e., a layer of silicon formed over an electrically insulative layer which is in contact with the silicon body surface; in this case, the silicon layer may eventually serve as the FET electrode. Alternatively, the masking layer may comprise a layer of silicon nitride involving a modification of the silicon nitride gate process described above.

For best results, the heating cycle involved in the diffusion step should be sufficient to diffuse the two buried regions which are eventually to provide the source and drain until the junctions between each of the two extended buried regions and the silicon body respectively intersect the body surface beneath the edge of the masking layer adjacent to the extended buried region. In this manner, complete coverage of the channel between the source and drain by the functional gate electrode is ensured without any substantial overlap of the source and drain at the surface of the silicon body.

The foregoing and other objects, features and advantages of the invention will be apparent from the following more particular description of the preferred embodiments of the invention, as illustrated in the accompanying drawings.

BRIEF DESCRIPTION OF THE DRAWINGS

FIGS. 1-7 are diagrammatic enlarged fragmentary views of a portion of an FET integrated circuit illustrating the steps involved in the fabrication of an FET in accordance with the present invention.

FIG. 8A is a graph showing the distribution, i.e., the conductivity-determining impurity concentration variation with depth of the drain region along line 8A—8A in FIG. 4.

FIG. 8B is a corresponding graph taken along line 8B—8B in FIG. 5.

FIG. 8C is a corresponding graph taken along line 8C—8C in FIG. 6.

DESCRIPTION OF THE PREFERRED EMBODIMENTS

Figure 1:
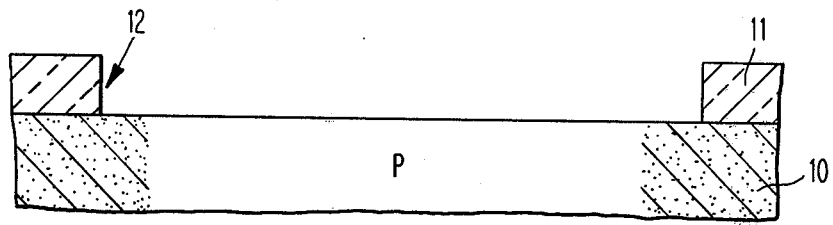

With reference to FIG. 1, on a P-type substrate 10 having a resistivity of about 0.1–1.0 ohm-cm, a layer of silicon dioxide having a thickness in the order of 9,000 Å is formed. The layer may be formed by conventional thermal oxidation techniques or it may be deposited by such conventional deposition techniques as chemical vapor deposition or sputter deposition. After the formation of layer 11, an opening 12 is formed in the layer by conventional photolithographic masking and etching techniques utilizing standard integrated circuit fabrication to produce the final structure shown in FIG. 1.

Figure 2:
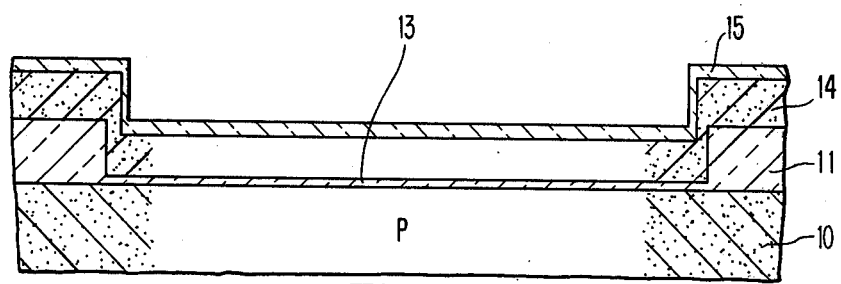

Next, FIG. 2, a thin layer of silicon dioxide 13, about 500 Å, is formed in opening 12, preferably by thermal growth. Then, a layer of silicon 14 is deposited over the structure utilizing conventional silicon deposition techniques, e.g., those described in U.S. Pat. No. 3,424,629. The deposition is conducted at temperatures in the order of from 500°–900° C., usually at ambient pressures. Since layer 14 is formed on silicon dioxide layers 11 and 13 it will, of course, be polycrystalline in structure. Layer 14 has a thickness in the order of 9,000 Å. Then, a layer of silicon dioxide 15, about 800 Å in thickness is formed utilizing the conventional silicon dioxide formation techniques described above, preferably by the thermal oxidation of a portion of the surface of silicon layer 14.

Figure 3:
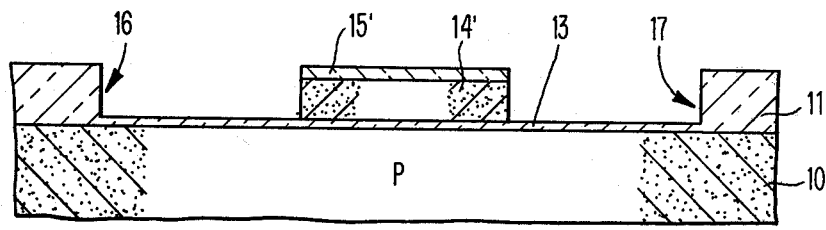

Next, as shown in FIG. 3, utilizing conventional photolithographic etching techniques, a mask of silicon dioxide 15' is formed over the portion of silicon layer 14 which is eventually to provide the gate electrode of the field effect transistor and the remaining portions of silicon layer 14 are removed by conventional selective etching techniques to leave silicon layer portion 14' in the gate region of the FET which is being formed. In order to remove layer 14 as shown, any conventional chemical etching technique which preferably etches silicon with respect to silicon dioxide may be used. A dilute nitric acid-hydrofluoric acid solution accomplishes this function. As a result, there are a pair of apertures 16 and 17 which correspond to the source and drain regions which are to be eventually formed in the field effect transistor being fabricated.

Figure 4:
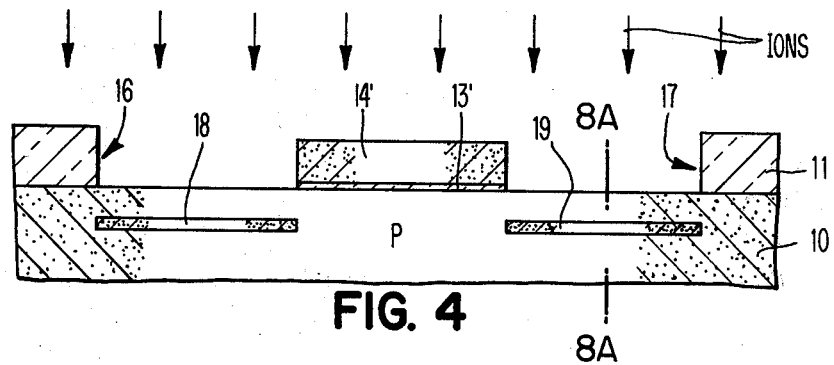

Next, FIG. 4, regions 18 and 19 are formed buried within substrate 10 by ion implantation. These regions are formed through the introduction of N-type impurities such as phosphorus into the substrate by ion implantation. The implantation step may be carried out directly through the unmasked relatively thin silicon dioxide layer 13 or as shown in FIG. 4, the portion of silicon dioxide layer 13 not covered by silicon layer 14' (indicated as 13') is removed by applying a conventional etchant for silicon dioxide such as buffered hydrofluoric acid to the structure in which case silicon dioxide layer 15' will also be removed while most of thicker layer 11 will remain intact. The ion implantation must be carried out at a sufficient dosage and energy to provide buried regions 18 and 19 with impurity distributions such that when the structure is subjected to the high heat condition in the order of 950° C. or higher necessary to diffuse regions 18 and 19 down to the desired bottom junction depths of junctions 20 and 21 in FIG. 5, then the same heat conditions will be sufficient to diffuse regions 18 and 19 upwardly so that they reach the upper surface of substrate 10 adjacent to silicon gate electrode 14'. In this connection, in order to have source and drain regions with relatively low sheet resistivities in the order of 8 to 10 ohms per square, it is desirable to have bottom depths of junctions 20 and 21 in the order of 1 micron into the substrate. Accordingly, for such final junction depths it is desirable that the initially implanted regions 18 and 19 in FIG. 4 be implanted at an energy level and dosage which will provide the impurity distribution profile shown in FIG. 8A which is the impurity distribution profile of the N-type impurities constituting regions 18 and 19 taken along line 8A—8A in FIG. 4. As the distribution profile in FIG. 8A indicates, regions 18 and 19 as originally introduced are fully enclosed within P substrate 10 and have an impurity distribution peak about 0.5 microns (5,000 Å) below the substrate surface. In order to form regions 18 and 19 with the distribution profiles shown, an ion implantation operation is carried out using conventional ion implantation equipment and techniques, as described, for example, in U.S. Pat. No. 3,756,862. Using, for example, the ion $^{31}P^+$, an energy level of 400 KeV and a dosage of about $10^{16}$ ions/cm$^2$ would be appropriate. The relatively large thicknesses of the silicon dioxide 11 and the silicon layer portion 14' prevent the implanted ions from reaching the substrate 10 directly beneath them. The implanted ions form an impurity distribution profile in the silicon portion 14' similar to that shown in FIG. 8A. The introduction of the impurity in the silicon layer portion 14' provides the highly desirable low sheet resistance to the silicon layer portion 14'.

Figure 5:
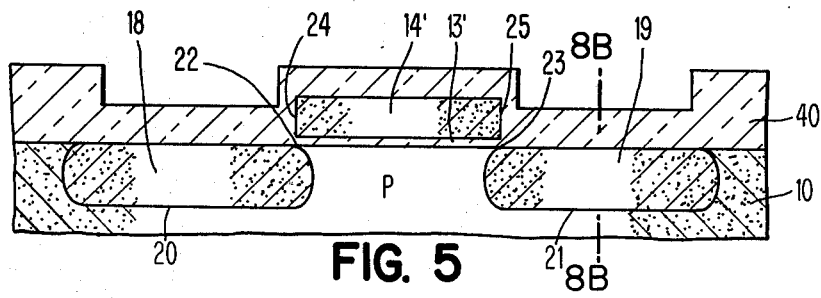

Then, the diffusion drive-in step to produce the structure shown in FIG. 5 is carried out at a temperature of about 950° C. in a conventional oxidizing atmosphere such as steam to diffuse source and drain regions 18 and 19 as shown in FIG. 5 and in particular so that these regions extend upward to the surface of P-type silicon body 10. Source and drain regions 18 and 19 then have the final impurity distribution profile shown in FIG. 8B which is taken along the line 8B—8B in FIG. 5. As a result of the oxidation process a layer of silicon dioxide 40 is formed over silicon body 10 as well as over polysilicon gate electrode 14'.

With respect to FIG. 5 and FIG. 8B, it should be seen that if the initial ion implantation in FIG. 4 has a peak almost exactly half-way between the surface and the final desired lowered junction depth of the source and drain region after diffusion, then the diffusion step to achieve the final source and drain junction depth shown in FIG. 5 will also be sufficient to extend the source and drain regions 18 and 19 upward so that they reach the surface at a point wherein the respective intersections 22 and 23 of these junctions with the surface of silicon body 10 will be laterally almost exactly aligned with the respective edges 24 and 25 of silicon electrode 14'. In order to make sure that intersections 22 and 23 at least coincide edges 24 and 25, that is to say, in order to make sure that the silicon electrode 14' and the underlying thin layer of silicon dioxide 13' fully extend up to the intersections 22 and 23, the initial ion implant cycle shown in FIG. 8A has a distribution such that subsequent to the diffusion step the final impurity concentration at the surface of regions 18 and 19 (point 26, FIG. 8B) is slightly higher than the background concentration (point 27, FIG. 8B) of the silicon body 10.

Next, FIG. 6, openings 31, 32, and 28 which are to respectively function as source, drain and gate electrode contact opening are formed through silicon dioxide layer 40. Because, as shown in FIG. 8B, the source and drain regions have relatively low surface concentration of phosphorus, it has been found to be desirable to make a shallow implantation through these contact openings of N-type impurities such as phosphorus to form surface regions 29, 30 and 34 respectively below the contact openings to the source and drain regions and gate electrode. These regions have a high N-type surface concentration in the order of $10^{21}$ atoms/cm$^3$ as indicated at point 33 in FIG. 8C (taken along line 8C—8C, FIG. 6). N+ contact regions 29, 30 and 34 may be formed by the introduction of impurities by any conventional means. However, it is preferable to form these by implanting N-type ions such as phosphorus utilizing the process described above at an energy level of about 40 KeV and a dosage of about $10^{16}$ ions/cm$^2$. In the final step, FIG. 7, a conventional contact and interconnection metallization level is formed including metallic contacts 35, 36, and 37 respectively to the source, drain and silicon gate electrode. This metallization which may be conveniently any standard integrated FET circuit metal such as aluminum may be formed by any integrated circuit metallization forming technique.

While the present invention has been specifically described using the self-aligned silicon gate technology, it will be understood that it is applicable to any other self-aligned gate technology so long as the impurity masking material which serves to self-align the thin gate insulation with respect to the silicon source and drain is a material which will not melt or otherwise decompose at conventional impurity diffusion temperatures, i.e., temperatures in the order of 1,000° C. or greater. This, of course, includes silicon nitride self-aligned gate techology wherein a thin layer of silicon nitride serves the initial purpose of self-aligning the source and drain with respect to the thin gate insulation. In addition, self-aligned gate processes which use refractory metals such as molybdenum, tungsten or tantalum in place of silicon may be modified to practice the process of the present invention.

While the invention has been particularly shown and described with reference to the preferred embodiments thereof, it will be understood by those skilled in the art that various changes in form and details may be made therein without departing from the spirit and scope of the invention.

What is claimed is:

1. A method for making a semiconductor device comprising
   forming a layer of ion beam masking material on the surface of a semiconductor body of one-type conductivity, said masking layer having formed therein at least one pair of adjacent apertures,
   directing a beam of ions of opposite-type conductivity at said masked body at energy and dosage levels sufficient to form a pair of buried regions of opposite-type conductivity fully enclosed within said one-type conductivity body beneath said pair of apertures, and
   heating to diffuse said pair of buried regions upward until the upward diffusion of said buried regions respectively extend to said surface beneath said apertures while the downward diffusion front remains spaced from the lower surface of the said semiconductor body, said masking material having a melting point above the temperature of said diffusion step.

2. The method of claim 1 wherein said semiconductor body is a silicon body.

3. The method of claim 2 wherein said apertures are formed completely through said layer.

4. A method for making a field effect transistor comprising:
forming a layer of an ion beam masking material on the surface of a semiconductor body of one-type conductivity having at least two adjacent apertures with at least the portion of said masking layer between said apertures and in contact with said surface being an electrically insulative material, directing a beam of ions of opposite-type conductivity at said masked body at energy and dosage levels sufficient to form two buried regions of opposite-type conductivity fully enclosed within said one-type conductivity body respectively beneath said two apertures, and heating to diffuse said two buried regions upward until the upward diffusion of said buried regions respectively extend to said surface beneath said two apertures while the downward diffusion front remains spaced from the lower surface of the said semiconductor body, said masking material having a melting point above the temperature of said diffusion step.

5. The method of claim 4 wherein said semiconductor body is a silicon body.

6. The method of claim 5 wherein at least the portion of the masking layer between said apertures is a composite comprising an electrically insulative layer in contact with said silicon body surface and a layer of silicon formed over said electrically insulative layer.

7. The method of claim 5 wherein at least the portion of the masking layer between said two apertures comprises a layer of silicon nitride.

8. The method of claim 5 wherein said heating is sufficient to diffuse said two buried regions until the junctions between each of the buried regions and the body respectively intersect said surface beneath the adjacent edge of said portion of said masking layer between said apertures.

9. The method of claim 5 including the further step subsequent to said heating steps of
forming a layer of electrically insulative material in said apertures over the silicon surface,
forming contact openings through said electrically insulative layer respectively to said two opposite-type conductivity regions, and
forming conductive contacts in said contact openings.

10. The method of claim 6 wherein said electrically insulative layer comprises silicon dioxide.

11. The method of claim 8 wherein
the surface concentration of said opposite-type conductivity-determining impurities in said source and drain regions in excess of the concentration of the one-type impurities determining the conductivity of the semiconductory body,
said excess being no greater than three times the concentration of said one-type impurities.

12. The method of claim 9 including the further step prior to the formation of said contacts of introducing impurities of said opposite-type through said contact opening respectively into said regions to form contact regions at the surfaces of said extended buried regions, said contact regions having a surface conductivity-determining impurity concentration greater than the surface concentration of conductivity-determining impurities of said extended buried regions.

* * * * *